United States Patent
Anholt et al.

(10) Patent No.: US 8,601,352 B1
(45) Date of Patent: Dec. 3, 2013

(54) EFFICIENT LDPC CODES

(75) Inventors: Micha Anholt, Tel Aviv (IL); Naftali Sommer, Rishon Lezion (IL); Tal Inbar, Hod-Hasharon (IL)

(73) Assignee: Apple Inc., Cupertino, CA (US)

( * ) Notice: Subject to any disclaimer, the term of this patent is extended or adjusted under 35 U.S.C. 154(b) by 562 days.

(21) Appl. No.: 12/843,029

(22) Filed: Jul. 25, 2010

Related U.S. Application Data (60) Provisional application No. 61/229,788, filed on Jul. 30, 2009, provisional application No. 61/303,415, filed on Feb. 11, 2010.

(51) Int. Cl.
*G06F 11/00* (2006.01)

(52) U.S. Cl.
USPC ............ 714/790; 714/794; 714/780; 714/752

(58) Field of Classification Search
USPC ..................... 714/752–758, 790–791, 794
See application file for complete search history.

(56) References Cited

U.S. PATENT DOCUMENTS

| | | | |
|---|---|---|---|
| 4,845,713 A | 7/1989 | Zook | |
| 5,267,242 A | 11/1993 | Levallee et al. | |
| 6,047,395 A | 4/2000 | Zook | |
| 6,353,909 B1 | 3/2002 | Amrany et al. | |
| 6,385,751 B1 | 5/2002 | Wolf | |
| 6,631,488 B1 | 10/2003 | Stambaugh et al. | |
| 6,938,196 B2 | 8/2005 | Richardson et al. | |
| 6,982,659 B2 | 1/2006 | Shen et al. | |
| 7,475,103 B2 | 1/2009 | Novichkov et al. | |
| 7,478,310 B2 | 1/2009 | Jung et al. | |
| 2005/0246611 A1* | 11/2005 | Jin et al. ........................ 714/754 |
| 2007/0089025 A1* | 4/2007 | Hong et al. .................... 714/758 |
| 2007/0162822 A1* | 7/2007 | Choi et al. ..................... 714/758 |

(Continued)

FOREIGN PATENT DOCUMENTS

| WO | 2007052991 A1 | 5/2007 |
|---|---|---|
| WO | 2007132453 A2 | 11/2007 |

(Continued)

OTHER PUBLICATIONS

Chase, D., "A Class of Algorithms for Decoding Block Codes with Channel Measurement Information", IEEE Transactions on Information Theory, vol. IT-18, No. 1, pp. 170-182, Jan. 1972.

(Continued)

*Primary Examiner* — Scott Baderman
*Assistant Examiner* — Jason Bryan
(74) *Attorney, Agent, or Firm* — Meyertons, Hood Kivilin, Kowert & Goetzel P.C.

(57) ABSTRACT

A method includes accepting a definition of a mother Error Correction Code (ECC) that is represented by a set of parity check equations and includes first code words, and a definition of a punctured ECC that includes second code words and is derived from the mother ECC by removal of one or more of the parity check equations and removal of one or more punctured check symbols selected from among check symbols of the first code words. A mother decoder, which is designed to decode the mother ECC by exchanging messages between symbol nodes and check nodes in accordance with a predefined interconnection scheme that represents the mother ECC, is provided. An input code word of the punctured ECC is decoded using the mother decoder by initializing one or more of the symbol nodes and controlling one or more of the messages, and while retaining the interconnection scheme.

34 Claims, 3 Drawing Sheets

(56) References Cited

U.S. PATENT DOCUMENTS

| | | | |
|---|---|---|---|
| 2007/0198895 | A1 | 8/2007 | Paumier et al. |
| 2008/0172592 | A1 | 7/2008 | Wehn et al. |
| 2008/0198650 | A1 | 8/2008 | Shalvi et al. |
| 2009/0024905 | A1 | 1/2009 | Shalvi et al. |
| 2009/0070659 | A1 | 3/2009 | Zhong et al. |
| 2009/0077449 | A1 | 3/2009 | Lee |
| 2009/0094470 | A1 | 4/2009 | Gao et al. |
| 2009/0106485 | A1 | 4/2009 | Anholt |
| 2009/0187803 | A1 | 7/2009 | Anholt et al. |
| 2009/0199074 | A1 | 8/2009 | Sommer |
| 2009/0249159 | A1 | 10/2009 | Lee et al. |
| 2009/0282320 | A1 | 11/2009 | Liao et al. |
| 2010/0275088 | A1* | 10/2010 | Graef .......................... 714/752 |
| 2010/0275089 | A1* | 10/2010 | Mow et al. ................... 714/752 |
| 2010/0306626 | A1 | 12/2010 | Keays et al. |

FOREIGN PATENT DOCUMENTS

| | | | |
|---|---|---|---|
| WO | 2007132457 | A2 | 11/2007 |
| WO | 2008026203 | A2 | 3/2008 |
| WO | 2008053472 | A2 | 5/2008 |
| WO | 2008139441 | A2 | 11/2008 |
| WO | 2009053961 | A2 | 4/2009 |
| WO | 2009072103 | A2 | 6/2009 |
| WO | 2009072105 | A2 | 6/2009 |
| WO | 2009074979 | A2 | 6/2009 |

OTHER PUBLICATIONS

Blahut, R.E., "Theory and Practice of Error Control Codes", chapter 6, sections 6.1-6.3, pp. 130-140, Addison-Wesley Publishing Company, Inc., USA, 1983.

Blahut, R.E., "Algebraic Codes for Data Transmission", chapter 6, pp. 131-166, and chapter 7, pp. 179-190, 217-233, Cambridge University Press, UK, 2004.

Chien, R.T., "Cyclic Decoding Procedures for Bose-Chaudhuri-Hocquenghem Codes", IEEE Transactions on Information Theory, vol. IT-10, pp. 357-363, Oct. 1964.

Lin et al., "Error control coding: fundamentals and applications", chapter 6, pp. 209-215; chapter 7, pp. 241-255; chapter 17.6, pp. 871-880, 2nd edition, Pearson Education, Inc., USA, 2004.

Anholt et al., U.S. Appl. No. 12/419,304 "High-Performance ECC Decoder" filed on Apr. 7, 2009.

Gallager, R.G., "Low-Density Parity-Check Codes", Cambridge, USA, Jul. 1963.

Bez et al., "Introduction to Flash memory", Proceedings of the IEEE, vol. 91, No. 4, pp. 489-502, Apr. 2003.

Eitan et al., "Multilevel Flash Cells and their Trade-Offs", Proceedings of the 1996 IEEE International Electron Devices Meeting (IEDM), pp. 169-172, New York, USA 1996.

Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.

Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.

Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.

Gallager, R.G., "Low-Density Parity-Check Codes", IRE Transactions on Information Theory, pp. 21-28, Jan. 1962.

Wu et al., "Parallel Weighted Bit-Flipping Decoding", IEEE Communication Letters, vol. 11, No. 08, pp. 671-673, Aug. 207.

Sharon et al., "Efficient Serial Message-Passing Schedules for LDPC Decoding", IEEE Transactions on Information Theory, vol. 53, No. 11, pp. 4076-4091, Nov. 2007.

Forney, D. G., "Generalized Minimum Distance Decoding", IEEE Transactions on Information Theory, vol. IT-12, No. 2, pp. 125-131, Apr. 1966.

Blahut, R., "Algebraic Codes for Data Transmission", Chapter 3.6, pp. 62-63, Cambridge University Press 2003.

Chen et al., "Small Area Parallel Chien Search Architectures for Long BCH Codes", IEEE Transactions on Very Large Scale Integration (VLSI) Systems, vol. 12, No. 5, pp. 656-549, May 2004.

Ha et al., "Rate-Compatible Punctured Low Density Parity Check Codes with Short Block Lengths", IEEE Transactions on Information Theory, vol. 52, No. 2, pp. 728-738, Feb. 2006.

Han et al., "An Efficient Dynamic Schedule for Layered Belief-Propagation Decoding of LDPC Codes", IEEE Communication Letters, vol. 13, No. 12, pp. 950-952, Dec. 2009.

IEEE Standard 802.11n-2009 "IEEE Standard for Information Technology—Telecommunications and Information Exchange Between Systems—Local and Metropolitan Area Networks—Specific Requirements Part 11: Wireless LAN Medium Access Control (MAAC) and Physical Layer (PHY) Specifications", Oct. 29, 2009.

Kim et al., "Design of Rate-Compatible Irregular LDPC Codes for Incremental Redundancy Hybrid ARQ Schemes", IEEE International Symposium on Information Theory (ISIT), pp. 1139-1143, Seattle, USA, Jul. 2006.

Kou et al., "Low Density Parity Check Codes Based on Finite Geometries: A Rediscovery and New Results", IEEE Transactions on Information Theory, vol. 47, No. 7, pp. 2711-2736, Nov. 2001.

Li et al., "Rate-Compatible Low Density Parity Check Codes for Capacity-Approaching ARQ Schemes in Packet Data Communications", Proceedings of the International Conference on Communications, Internet and Information Technology (CIIT), U.S. Virgin Islands, Nov. 2002.

Yazdani et al., "On Construction of Rate-Compatible Low-Density Parity-Check Codes", IEEE Communication Letters, vol. 8, No. 3, pp. 159-161, Mar. 2004.

U.S. Appl. No. 12/797,615 "Chien search using multiple basis representation", filed Jun. 10, 2010.

U.S. Appl. No. 12/728,289 "Dual ECC decoder", filed Mar. 22, 2010.

Darabiha et al., "Power Reduction Techniques for LDPC Decoders", IEEE Journal of Solid-State Circuits, vol. 43, No. 8, pp. 1835-1845, Aug. 2008.

Whiting, D.L., "Bit-Serial Reed-Solomon Decoders in VLSI", Doctor Thesis, California Institute of Technology, Aug. 22, 1984.

U.S. Appl. No. 12/355,817 Official Action dated Dec. 22, 2011.

* cited by examiner

EFFICIENT LDPC CODES

CROSS-REFERENCE TO RELATED APPLICATIONS

This application claims the benefit of U.S. Provisional Patent Application 61/229,788, filed Jul. 30, 2009, and U.S. Provisional Patent Application 61/303,415, filed Feb. 11, 2010, whose disclosures are incorporated herein by reference.

FIELD OF THE INVENTION

The present invention relates generally to error correction coding, and particularly to efficient error correction codes.

BACKGROUND OF THE INVENTION

Error Correction Codes (ECC) are used in a variety of applications, such as in various digital communication and data storage applications. Some systems use a special class of block codes called Low Density Parity Check (LDPC) codes. LDPC codes are described, for example, by Gallager, in "Low Density Parity Check Codes," MIT Press, 1963, which is incorporated herein by reference. Chapter 4 of this book describes decoding of LDPC codes. Lin and Costello describe iterative algorithms for decoding LDPC codes, as well as several example decoder configurations, in "Error Control Coding," Prentice Hall, second edition, June, 2004, Chapter 17.6, pages 871-880, which is incorporated herein by reference. Other example techniques for encoding and decoding of LDPC codes are described in U.S. Patent Application Publications 2009/0070659 and 2009/0249159, whose disclosures are incorporated herein by reference.

In some applications, a rate-compatible code is derived from a mother code using shortening, puncturing and/or extension of the mother code. Example techniques for designing, encoding and decoding Rate-compatible LDPC codes are described by Ha et al., in "Rate-Compatible Punctured Low Density Parity Check Codes with Short Block Lengths," IEEE Transactions on Information Theory, volume 52, number 2, February, 2006, pages 728-738; by Li and Narayanan, in "Rate-Compatible Low Density Parity Check Codes for Capacity-Approaching ARQ Schemes in Packet Data Communication," Proceedings of the International Conference on Communications, Internet and Information Technology (CIIT), U.S. Virgin Islands, November, 2002; and by Yazdani and Banihashemi, in "On Construction of Rate-Compatible Low-Density Parity-Check Codes," Proceedings of the IEEE International Conference on Communication (ICC), Paris, France, June, 2004, pages 430-434, which are incorporated herein by reference.

Other example techniques for designing rate-compatible LDPC codes are described by Kim et al., in "Design of Rate-Compatible Irregular LDPC Codes for Incremental Redundancy Hybrid ARQ Schemes," IEEE International Symposium on Information Theory (ISIT), Seattle, Wash., July, 2006, pages 1139-1143; by Kou et al., in "Low Density Parity Check Codes Based on Finite Geometries: A Rediscovery and New Results," IEEE Transactions on Information Theory, volume 47, number 7, November, 2001, pages 2711-2736, which is incorporated herein by reference.

Rate-compatible codes are also addressed in IEEE standard 802.11n-2009, entitled "IEEE Standard for Information Technology—Telecommunications and Information Exchange Between Systems—Local and Metropolitan Area Networks—Specific Requirements Part 11: Wireless LAN Medium Access Control (MAC) and Physical Layer (PHY) Specifications," Oct. 29, 2009; and by Blahut, in "Algebraic Codes for Data Transmission," Cambridge University Press, 2004, chapter 3, pages 62-63, which are incorporated herein by reference.

SUMMARY OF THE INVENTION

An embodiment of the present invention that is described herein provides a method for error correction coding, including:

accepting a first definition of a mother Error Correction Code (ECC), which is represented by a set of parity check equations and includes first code words, each first code word including one or more check symbols;

accepting a second definition of a punctured ECC including second code words, which is derived from the mother ECC by removal of one or more of the parity check equations and removal of one or more punctured check symbols, selected from among the check symbols of the first code words;

providing a mother decoder, which is designed to decode the first code words of the mother ECC by exchanging messages between symbol nodes and check nodes in accordance with a predefined interconnection scheme that represents the mother ECC; and decoding an input code word of the punctured ECC using the mother decoder by initializing one or more of the symbol nodes and controlling one or more of the exchanged messages responsively to the punctured ECC, and while retaining the predefined interconnection scheme representing the mother ECC.

In some embodiments, the mother ECC and the punctured ECC include Low Density Parity Check (LDPC) codes. In an embodiment, initializing the symbol nodes includes assigning the symbol nodes corresponding to the symbols of the input code word respective confidence metrics, and assigning the symbol nodes corresponding to the punctured check symbols respective artificial confidence metrics that indicate a given symbol value with high likelihood. In a disclosed embodiment, the artificial confidence metrics indicate a zero symbol value with maximal likelihood. In another embodiment, assigning the artificial confidence metrics includes forcing the symbol nodes corresponding to the punctured check symbols to maintain the artificial confidence metrics during decoding of the input code word.

In yet another embodiment, controlling the exchanged messages includes preventing the messages originating from one or more check nodes that correspond to the parity check equations that were removed from the mother code from affecting the symbol nodes. Preventing the messages from affecting the symbol nodes may include forcing the messages originating from the one or more check nodes to zero. In still another embodiment, the method includes outputting respective values of the symbol nodes as a decoding result of the input code word.

In an embodiment, the mother ECC is representable by a parity check matrix, and the method includes producing the code word of the punctured ECC by removing from the parity check matrix of the mother ECC one or more columns corresponding to the removed check symbols and one or more rows corresponding to the removed parity check equations, to produce a modified parity check matrix, and encoding data using the modified parity check matrix, to produce the code word of the punctured ECC. In an embodiment, the set of the parity check equations is representable by a block matrix including multiple blocks, such that some of the blocks include all-zeros sub-matrices, and all the blocks other than the all-zeros sub-matrices include circulant sub-matrices.

There is additionally provided, in accordance with an embodiment of the present invention, a method for error correction coding, including:

accepting a code word, which includes data encoded with an Error Correction Code (ECC) that is representable by a parity check matrix including matrix elements arranged in rows and columns, such that at least a predefined portion of the columns include respective runs of two or more consecutive non-zero matrix elements, and such that the runs in adjacent columns are located at respective row positions that are not all linearly related to one another; and decoding the code word so as to reconstruct the data.

In an embodiment, the predefined portion includes 85% of the columns. In another embodiment, the predefined portion includes 90% of the columns. In a disclosed embodiment, the respective row positions of the runs in a given portion of adjacent column triplets do not advance by a fixed increment. In an embodiment, the row positions of the runs are uncorrelated with one another. In an embodiment, the row positions of the runs are random. In some embodiments, the non-zero matrix elements make up no more than 10% of all the matrix elements in the parity check matrix. In an embodiment, the parity check matrix includes a block matrix, the non-zero matrix elements include circulant sub-matrices, and the matrix elements other than the non-zero elements include all-zeros sub-matrices. In some embodiments, the circulant sub-matrices include cyclically-shifted identity sub-matrices.

There is also provided, in accordance with an embodiment of the present invention, apparatus for error correction coding, including:

decoding circuitry, which is configured to decode a mother Error Correction Code (ECC) that is represented by a set of parity check equations and includes first code words each including one or more check symbols, by exchanging messages between symbol nodes and check nodes in accordance with a predefined interconnection scheme that represents the mother ECC; and control circuitry, which is configured to accept a definition of a punctured ECC including second code words, which is derived from the mother ECC by removal of one or more of the parity check equations and removal of one or more punctured check symbols, selected from among the check symbols of the first code words, and to cause the decoding circuitry to decode an input code word of the punctured ECC by initializing one or more of the symbol nodes and controlling one or more of the exchanged messages responsively to the punctured ECC, while retaining the predefined interconnection scheme representing the mother ECC.

There is further provided, in accordance with an embodiment of the present invention, apparatus for error correction coding, including:

control circuitry, which is configured to accept a definition of an Error Correction Code (ECC) that is representable by a parity check matrix including matrix elements arranged in rows and columns, such that at least a predefined portion of the columns include respective runs of two or more consecutive non-zero matrix elements, and such that the runs in adjacent columns are located at respective row positions that are not all linearly related to one another; and decoding circuitry, which is configured to accept a code word, which includes data encoded with the ECC and to decode the code word so as to reconstruct the data.

The present invention will be more fully understood from the following detailed description of the embodiments thereof, taken together with the drawings in which:

DETAILED DESCRIPTION OF EMBODIMENTS

Overview

Embodiments of the present invention that are described hereinbelow provide improved methods and devices for designing efficient Error Correction Codes (ECC), and for encoding and decoding such codes. The embodiments described herein focus on Low Density Parity Check (LDPC) codes, although the disclosed techniques are applicable to various other code types, as well. The methods and devices described herein can be used in a variety of ECC applications, such as in communication and data storage systems.

Each code word of an LDPC code typically comprises multiple data symbols and multiple check symbols. The code is defined by a set of parity check equations, and is decodable by evaluating the parity check equations on the symbols of a received code word. For example, an LDPC decoder may use an iterative message-passing decoding process. In such a process, each symbol of the code word is represented by a symbol node, and each parity check equation is represented by a check node. The symbol nodes and check nodes are interconnected according to the symbols that participate in the different parity check equations. The decoder updates the symbol nodes and check nodes iteratively by exchanging messages among the interconnected nodes, attempting to converge to a valid code word.

In some ECC applications, various LDPC codes having various code word sizes and coding rates are derived from a predefined mother code. Different codes can be derived from a mother code, for example, by shortening (removing data symbols from the code word) or puncturing (removing check symbols from the code word). This sort of configurability enables matching the code to specific requirements or operating conditions, such as bandwidth, memory space and distortion level.

In some embodiments of the present invention, an LDPC decoder that is designed to decode a certain mother code is configurable to decode various punctured/shortened LDPC codes that are derived from the mother code. The decoder decodes code words of the mother code by exchanging messages between symbol nodes and check nodes in accordance with an interconnection scheme that represents the mother code.

In the disclosed techniques, the decoder is configured to decode code words of a punctured/shortened code that is derived from the mother code by removal of one or more check symbols and one or more parity check equations. The decoder decodes the code words of the punctured/shortened code by initializing one or more of the symbol nodes and controlling the exchange of messages responsively to the punctured/shortened code. The interconnection scheme between the symbol nodes and the check nodes, which represents the mother code, is not changed.

In an example embodiment, the decoder is configured to decode a given punctured/shortened code by:

Initializing the symbol node of each removed check symbol or data symbol with a confidence metric e.g., Log Likelihood Ratios (LLR), which indicates a predefined symbol value (e.g., zero) with high confidence.

During the message exchange in the decoder, preventing messages originating from the check nodes corresponding to the removed parity check equations from affecting the symbol nodes.

In the disclosed techniques, the decoder accounts for the punctured/shortened symbols and the removed parity check equations by proper symbol node initialization and selective control of check node messages. The basic interconnection scheme between the symbol nodes and the check nodes is not modified when configuring the decoder for different punctured/shortened codes. Using these techniques, configurable decoders can therefore be constructed with lower complexity, cost and size.

In other embodiments that are described herein, the LDPC code is designed in a manner that reduces the power consumption and latency of the decoder. An LDPC code can be represented by a sparse parity check matrix, whose columns correspond to the code word bits and whose rows correspond to the parity check equations. A non-zero matrix element at the intersection of a given row and a given column indicates that the bit corresponding to the given column participates in the parity check equation corresponding to the given row. Some LDPC decoders evaluate the parity check equations on an input code word by scanning the parity check matrix row by row.

In some embodiments, a disclosed LDPC code has a parity check matrix whose columns comprise runs of two or more consecutive non-zero elements. As will be explained and demonstrated below, concentrating the non-zero elements in runs reduces the number of memory read operations performed by the decoder, and therefore reduces the decoder's power consumption and latency. In order to preserve the decoding performance (e.g., coding gain or error rate) of the code, however, at least a predefined portion (e.g., 90% or 85%) of the columns of the parity check matrix comprise runs of successive non-zero matrix elements. Moreover, the runs are located at row positions that are not all linearly related to one another. As a result, the disclosed LDPC codes enable the decoder to achieve low power consumption and small latency, with little or no degradation in coding gain.

System Description

Figure 1:
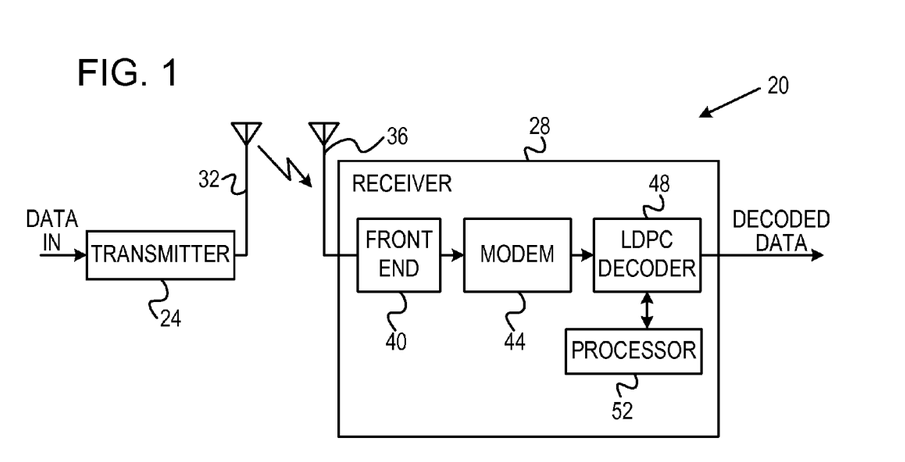
FIG. 1 is a block diagram that schematically illustrates a communication system that uses a Low Density Parity Check (LDPC) code, in accordance with an embodiment of the present invention.

FIG. 1 is a block diagram that schematically illustrates a wireless communication system 20 that employs error correction coding using a Low Density Parity Check (LDPC) code, in accordance with an embodiment of the present invention. System 20 comprises a transmitter 24, which transmits data to a receiver 28. The transmitter accepts input data, encodes the data with an LDPC code, modulates the encoded data in accordance with a certain modulation scheme, converts the modulated digital signal to an analog signal, up-converts the analog signal to a suitable Radio frequency (RF), and transmits the RF signal toward the receiver using a transmit antenna 32.

In receiver 28, a receive antenna 36 receives the RF signal and provides it to a RF front end 40. The front end down-converts the RF signal to baseband or to a suitable Intermediate Frequency (IF), and digitizes the signal with a suitable Analog to Digital Converter (ADC—not shown in the figure). The digitized signal carrying the encoded data is demodulated by a modem 44, and the LDPC code is decoded by an LDPC decoder 48. Decoder 48 is controlled by a processor 52. The structure and functionality of decoder 48 are described in detail below. By decoding the LDPC code, decoder 48 reconstructs the data that was input to transmitter 24. The reconstructed data is provided as the receiver output.

System 20 may comprise, for example, a cellular system, a satellite system, a point-to-point communication link, or any other suitable communication system that employs Error Correction Coding (ECC). Although the example of FIG. 1 refers to a wireless communication system, the techniques described herein can be used with wire-line communication systems, such as cable communication systems, as well.

Figure 2:
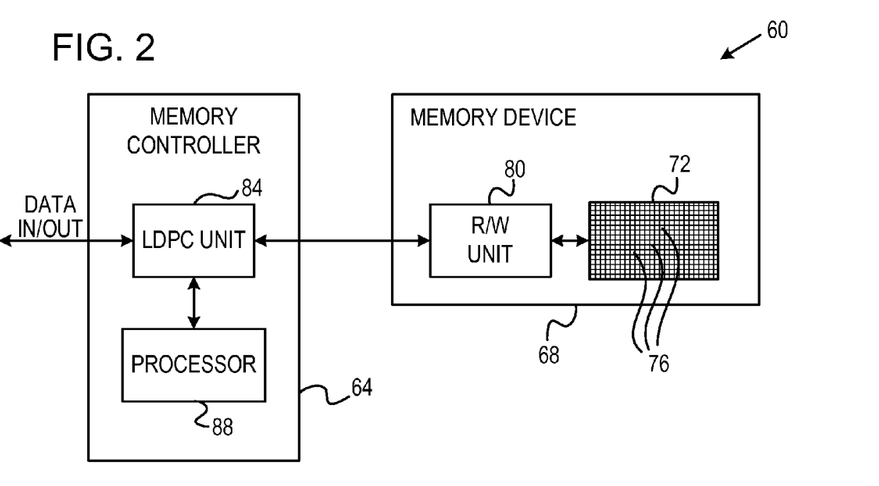
FIG. 2 is a block diagram that schematically illustrates a data storage system that uses an LDPC, in accordance with an embodiment of the present invention.

FIG. 2 is a block diagram that schematically illustrates a data storage system 60 that employs error correction coding using an LDPC code, in accordance with an alternative embodiment of the present invention. System 60 comprises a memory controller 64, which stores data in a memory device 68. The memory device comprises an array 72 comprising multiple memory cells 76. Array 72 may comprise any suitable type of volatile or non-volatile memory, such as, for example, Random Access Memory (RAM) or Flash memory. Alternatively, device 68 may comprise a magnetic storage device such as a Hard Disk Drive (HDD), or any other suitable storage medium. System 60 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

Memory device 68 comprises a Read/Write (R/W) unit 80, which writes data values into memory cells 76 and reads data values from the memory cells. Memory controller 64 comprises an LDPC unit 84, which encodes the data for storage with an LDPC code, and decodes the LDPC-encoded data that is retrieved from the memory cells. Unit 84 is controlled by a processor 88. The structure and functionality of unit 84 are described in detail below.

In the embodiments described herein, systems 20 and use an LDPC code. The techniques described herein, however, are not limited to LDPC codes and can be used with various other types of ECC. The error correction schemes described herein can be used in communication systems such as system 20, as well as in data storage systems such as system 60. The description that follows applies to both communication applications and to storage applications, and refers generally to an LDPC decoder. Any reference to a decoder applies to decoder 48 of system 20, as well as to the decoder functionality of unit 84 in system 60. Any reference to a processor applies to processor 52 of system 20, as well as to processor 88 in system 60. Alternatively, the methods described herein can be carried out by any other suitable element in any other suitable system that involves ECC decoding.

Efficient Decoding of Rate-Compatible LDPC Codes

Typically, a code word of an LDPC code comprises multiple data symbols and multiple check symbols. The LDPC code is defined by a set of parity check equations, and the LDPC code is decoded by evaluating the parity check equations on the data symbols and check symbols of a received code word.

In some applications, it is desirable to modify the LDPC code parameters, such as the code word size and the redundancy size (i.e., the number of check symbols per code word) to match certain requirements. One way of modifying the code parameters is to produce various LDPC codes from a mother code by removing symbols from the code words of the mother code. Removal of data symbols is referred to as shortening, and removal of check symbols is referred to as puncturing.

In some embodiments of the present invention, the LDPC decoder accepts input code words of a punctured LDPC code, which is derived from a code word of a mother code by removal of one or more data symbols and/or one or more check symbols, as well as removal of one or more of the parity check equations. The LDPC decoder decodes the code words efficiently by appropriately accounting for the removed symbols and equations, as will be explained below.

In some known puncturing schemes, a code word of the punctured code is produced by encoding the data with the full mother code, and then removing one or more of the check symbols. In some embodiments of the present invention, by contrast, the encoder (e.g., unit 84 in memory controller 64 of FIG. 2, or an LDPC decoder in transmitter 24 of FIG. 1) first modifies the parity check matrix H of the mother code. The encoder modifies matrix H by removing the matrix columns that correspond to the removed check symbols, and also removing one or more rows from the matrix (equivalent to removing one or more of the parity check equations). The resulting modified matrix, denoted H', is used for encoding the data.

The disclosed encoding scheme is superior to the known puncturing schemes because it relieves the decoder from the need to reconstruct the removed check symbols, which degrades decoding performance. In the disclosed scheme, the check symbols in question are removed completely without a need to reconstruct them. Both the encoder and the decoder use a modified parity check matrix that accounts for the removed parity check symbols and parity check equations.

Figure 3:
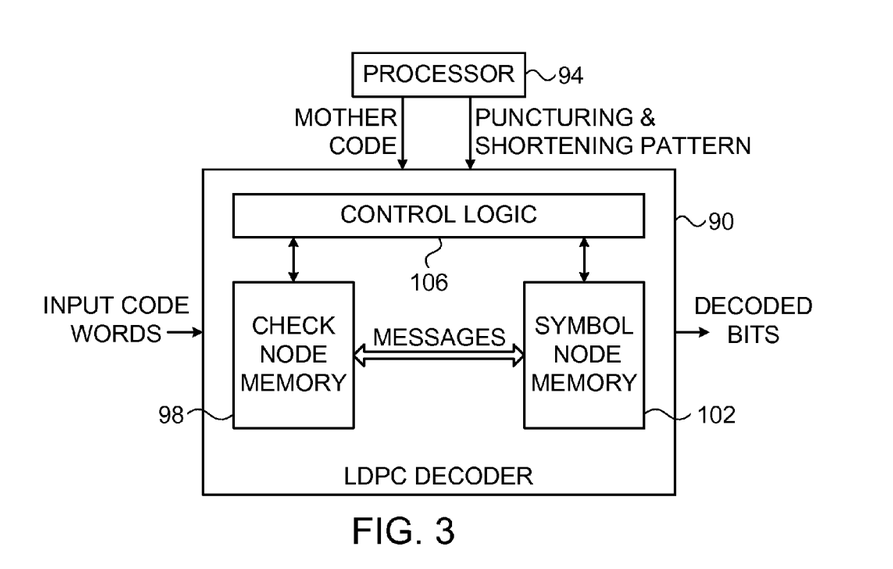
FIG. 3 is a block diagram that schematically illustrates an LDPC decoder, in accordance with an embodiment of the present invention.

FIG. 3 is a block diagram that schematically illustrates an LDPC decoder 90, in accordance with an embodiment of the present invention. Decoder 90 can be used to implement decoder 48 of FIG. 1 above, or the decoding functionality of unit 84 of FIG. 2 above. Decoder 90 is controlled and operated by a processor 94, e.g., processor 52 of FIG. 1 above or processor 88 of FIG. 2 above. Processor 94 initializes decoder 90 to decode a certain punctured/shortened LDPC code, which is derived from a predefined mother code by shortening and/or puncturing and by removal of parity check equations. (Typically although not necessarily, the number of removed equations is equal to the number of punctured check symbols.) After initialization, the decoder accepts input code words of the punctured/shortened code and decodes them to produce decoded data.

During initialization, decoder 90 typically receives from processor 94 a definition of the mother code, e.g., a list of parity check equations or a parity check matrix. Decoder 90 also accepts from processor 94 a definition of the shortened and/or punctured symbols, i.e., an indication of the indices of the data symbols and/or check symbols that were removed from the code words of the mother code in order to produce the punctured/shortened code. In addition, processor 94 indicates to decoder 90 which parity check equations were removed from the mother code when producing the punctured/shortened code. The latter two definitions are referred to as a puncturing/shortening pattern.

Decoder 90 decodes each input code word by performing an iterative decoding process, which is also referred to as a message-passing process. In such a process, the symbols of the code word are represented by respective symbol nodes, the parity check equations are represented by respective check nodes, and the decoder evaluates the parity check equations iteratively by passing messages between the symbol nodes and the check nodes. The message-passing process typically comprises a Belief-Propagation (BP) process, but may alternatively comprise any other suitable process. (When the mother code and the punctured/shortened code comprise binary codes, the data and check symbols reduce to data bits and check bits, and the symbol nodes are referred to as bit nodes. The following description uses the more general terminology of symbols, which applies to both binary and non-binary codes.)

Decoder 90 comprises a check node memory 98 and a symbol node memory 102, which hold the current values of the check nodes and the symbol nodes, respectively, during the iterative decoding process. Typically, the symbol node memory holds respective confidence metrics (e.g., Log-Likelihood Ratios—LLRs) for the symbol nodes. Each confidence metric indicates the likelihood that the respective symbol in the code word has a given value. The embodiments described herein refer mainly to LLRs, but the disclosed techniques can alternatively be used with various other types of confidence metrics. When the mother code and the punctured/shortened code comprise binary codes, the confidence metrics may comprise tentative bit values.

The iterative decoding process is carried out by control logic 106, which in particular exchanges messages between the symbol nodes and the check nodes. Typically, each symbol node sends messages to the check nodes representing the equations in which the symbol appears. A given check node, which represents a given parity check equation, sends feedback messages to the symbol nodes of the symbols that appear in this equation. In a typical flow, logic 106 initializes the symbol nodes with some initial LLRs. Logic 106 then evaluates the parity check equations by passing messages from the symbol nodes to the check nodes, updating the check nodes based on the messages, passing feedback messages from the check nodes back to the symbol nodes, and updating the LLRs in the symbol nodes based on the feedback messages. This process is repeated until converging to a valid code word or until meeting a certain termination criterion.

In the present example, the symbol nodes and the check nodes represent the mother code. In particular, the interconnections between the symbol nodes and the check nodes reflect the parity check equations of the mother code, regardless of any punctured symbols, shortened symbols and/or removed check equations used in the punctured/shortened code. Nevertheless, logic 106 of decoder 90 uses the symbol nodes and check nodes efficiently in order to decode code words of the punctured/shortened code. In some embodiments, decoder 90 decodes an input code word of the punctured/shortened code by performing the following actions:

For each shortened symbol (removed data symbol) and for each punctured symbol (removed check symbol), logic 106 forces the corresponding symbol node to have an artificial LLR. The artificial LLR has a maximum value, i.e., indicates a predefined symbol value with high likelihood. In some embodiments, the artificial LLR values are forced only during initialization. In alternative embodiments, the artificial LLR values are forced throughout the decoding process.

During the message-passing process, logic 106 prevents any feedback message, which originates from a check node that corresponds to a removed parity check equation, from affecting the symbol nodes.

This technique enables the decoder to use the symbol node and check node configuration of the mother code for decoding any punctured/shortened code that is derived from the mother code. Adaptation to different punctured/shortened code is performed in a straightforward manner by assigning maximum LLRs to different symbol nodes and by inhibiting different feedback messages. These adaptations, however, generally do not affect the basic structure of the decoder. Thus, the same decoder can be configured to decode any desired punctured/shortened code that is derived from the mother code.

Decoder 90 of FIG. 3 can be partitioned into decoding circuitry and control circuitry. The decoding circuitry is designed to decode the mother code by exchanging messages between the symbol nodes and the check nodes in accordance with the interconnection scheme that represents the mother code. The control circuitry causes the decoding circuitry to decode a given punctured/shortened code by initialization of the symbol nodes and control of the message exchange between the symbol nodes and the check nodes responsively to the punctured/shortened code. The decoding circuitry typically comprises symbol node memory 102, check node memory 98 and part of logic 106. The control circuitry comprises part of logic 106. In some embodiments, some functions of the control circuitry can be carried out by processor 94.

Figure 4:
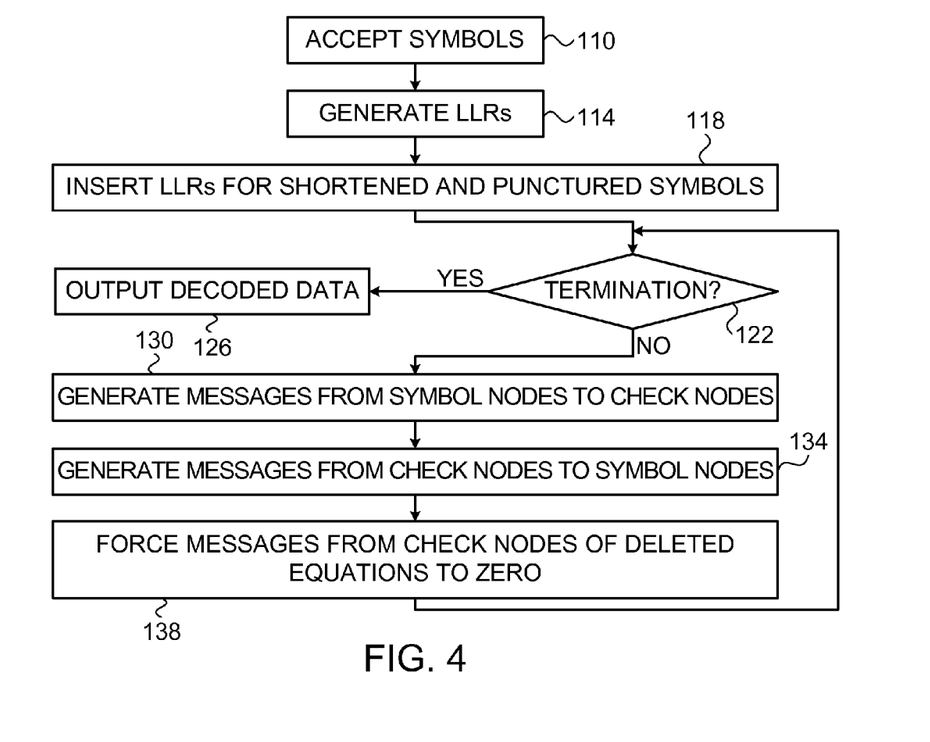
FIG. 4 is a flow chart that schematically illustrates a method for LDPC decoding, in accordance with an embodiment of the present invention.

FIG. 4 is a flow chart that schematically illustrates a method for LDPC decoding, carried out by decoder 90, in accordance with an embodiment of the present invention. The method begins with decoder 90 accepting an input code word of a punctured/shortened code that is derived from the mother code, at an input step 110. The input code word comprises multiple symbols, including at least one data symbol and at least one check symbol. Logic 106 computes initial LLRs for the symbols of the input code word, at a metric initialization step 114. In addition, logic 106 produces artificial LLRs for the shortened and punctured symbols of the mother code, at an artificial metric generation step 118. The artificial LLRs are set to a maximal value, i.e., indicate that the shortened and punctured symbols are highly likely to have a certain predefined symbol value (e.g., zero).

Logic 106 initializes the symbol nodes in memory 102 with the initial LLRs, including the artificial LLRs. At this stage, the symbol nodes corresponding to the symbols of the input code word are initialized with certain initial LLRs, and the symbol nodes of the punctured and shortened symbols are initialized with maximal LLRs. Logic 106 now begins the iterative message-passing decoding process.

Logic 106 checks whether the process has terminated, at a termination checking step 122. The iterative process may terminate, for example, when a valid code word of the punctured/shortened code is reached, or upon meeting another predefined termination criterion. If the process has terminated, the decoder produces decoded data based on the current values of the symbol nodes, and outputs the decoded data, at an output step 126.

If the iterative process has not yet terminated, the decoder performs a decoding iteration in which messages are passed between the symbol nodes and the check nodes. The decoder generates messages from the symbol nodes to the check nodes, at a first messaging step 130. The decoder generates messages from the check nodes back to the symbol nodes, at a second messaging step 134.

Some of the messages that are generated at step 134 originate from check nodes, which correspond to parity check equations that were removed from the mother code (i.e., equations that are part of the mother code but not of the punctured code). In some embodiments, the decoder prevents such messages from affecting the symbol nodes, at a message suppression step 138. The decoder may prevent the messages from affecting the symbol nodes in various ways, such as by forcing their value to zero or to another value that has little or no impact on the LLRs held by the symbol nodes. Alternatively, the decoder may prevent the check nodes, which correspond to the removed parity check equations, from generating messages in the first place. Further alternatively, the decoder may discard any messages that are generated by the check nodes in question, or otherwise prevent these messages from reaching the symbol nodes. As yet another example, the decoder may cause the symbol nodes to disregard the messages in question when updating the LLRs.

Following the message exchange between the symbol nodes and the check nodes, the decoder updates the LLRs of the symbol nodes, and the method loops back to step 122 above, in which the decoder check whether an additional iteration is needed.

In the example decoding process of FIG. 4, the symbol nodes first send messages to the check nodes (step 130), and only then the check nodes send messages to the symbol nodes (step 134). This sort of process, however, is shown purely for the sake of conceptual clarity. In alternative embodiments, messaging in the two directions (symbol nodes to check nodes and vice versa) may be interleaved or parallelized as desired.

As explained above, at step 118 the decoder initializes the symbol nodes of the punctured and shortened symbols with maximal-value LLRs. In some embodiments, the decoder continues to force these symbol nodes to hold the maximal-value LLRs during the iterative decoding process. In alternative embodiments, the decoder forces the maximal-value LLRs only at initialization, and allows the LLRs of the punctured and shortened symbols to change during the iterative decoding process. The former embodiment may achieve superior performance, whereas the latter embodiment may be simpler to implement. The symbol value indicated by the forced maximal-value LLRs may comprise any suitable value, such as "0" or "1".

In some embodiments, the ECC used in the method of FIG. 4 is representable by a Quasi-Cyclic (QC) parity check matrix, as will be defined further below.

Efficient Design of LDPC Matrices

In some embodiments, the LDPC code used in system 20 or system 60 is designed so as to reduce the power consumption and latency of the decoder. In a typical implementation, the decoder comprises control circuitry (e.g., part of logic 106 of FIG. 3 above) that accepts and/or holds a definition of the LDPC code, and decoding circuitry (e.g., symbol node memory 102, check node memory 98 and part of logic 106 of FIG. 3 above) that decodes code words of this code.

An LDPC code can typically be represented by a parity check matrix H. A vector c is a valid code word if Hc=0. Each column of matrix H corresponds to a respective bit of the code word, and each row of the matrix corresponds to a respective parity check equation. Matrix H is typically sparse, i.e., contains a small portion of non-zero elements, since each parity check equation operates on a relatively small number of code word bits.

Figure 6:
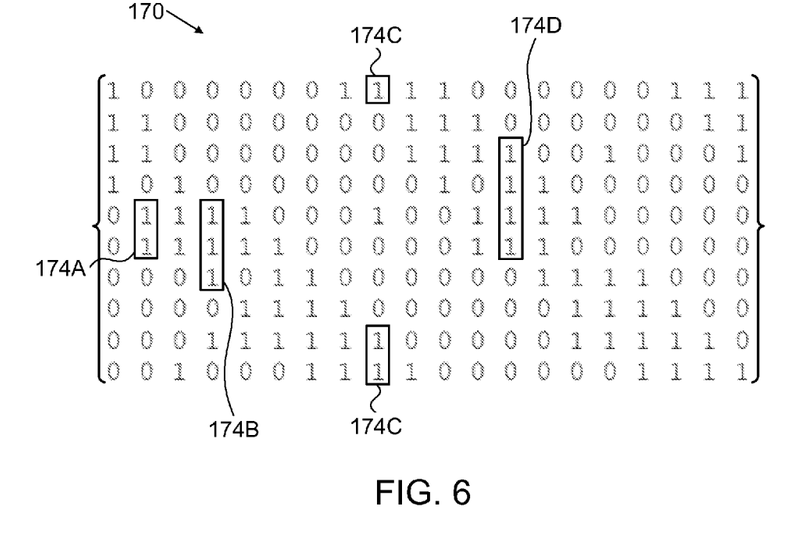
FIG. 6 is a diagram showing a parity check matrix of an LDPC code, in accordance with an embodiment of the present invention.

In some embodiments, the LDPC code is designed such that the columns of matrix H comprise runs of multiple consecutive non-zero elements with high likelihood. An example of a parity check matrix of this sort is shown in FIG. 6 below. Concentrating the non-zero elements of a given column in runs reduces the number of memory readout operations performed by the decoder, and thus reduces the decoder's power consumption and latency.

Figure 5:
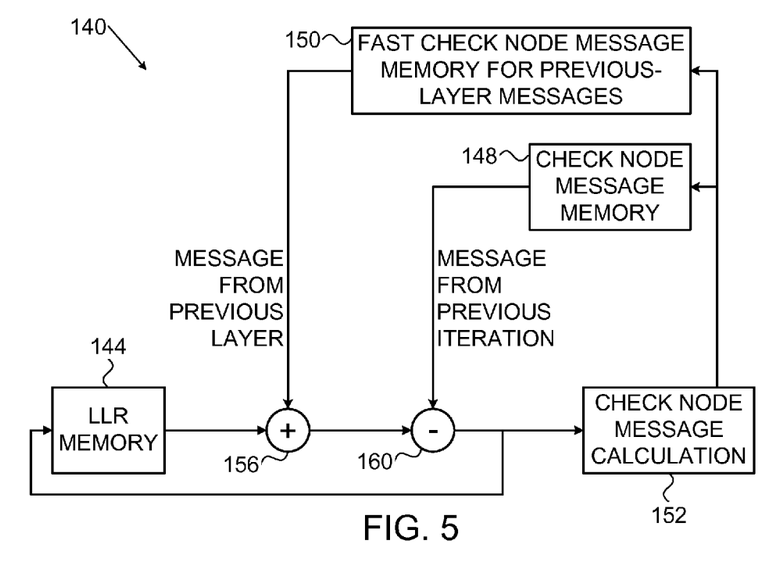
FIG. 5 is a block diagram that schematically illustrates elements of an LDPC decoder, in accordance with an embodiment of the present invention.

FIG. 5 is a block diagram that schematically illustrates elements of an LDPC decoder 140, in accordance with an embodiment of the present invention. In the present example, decoder 140 comprises a LLR memory 144, two check node message memories 148 and 150, a check node message calculation unit 152, an adder 156 and a subtractor 160.

Decoder 140 typically decodes an input code word by applying one parity check equation at a time (or, equivalently, one row of parity check matrix H) to the input code word. The decoder scans the rows of matrix H sequentially. The matrix rows are also referred to as layers. (An alternative representation in which each layer comprises multiple parity check equations is described further below.) Each LLR in memory 144 corresponds to a respective bit node, and thus to a respective column in matrix H. When processing a given row of matrix H, the decoder typically scans the currently-processed row element by element. If the current matrix element is zero, the decoder skips it and moves to the next element in the row. This way, the number of clock cycles that are required to process a row is proportional to the number of nonzero elements in the row and not to the total length of the row.

In the present example, check node message memory 150 comprises a relatively fast and small memory, e.g., comprising a set of registers. This memory holds the results (check node messages) produced during processing of the previous layer (i.e., processing of the previous row or row group of the matrix). Check node message memory 148 is typically larger and slower, and holds the check node messages of all layers. For example, for Quasi-Cyclic (QC) LDPC codes (defined further below), the check node message may be very long (e.g., thousands of bits). Such a message is typically stored in a memory with a much smaller bus width (e.g., 32 bits), so reading each message takes many clock cycles.

At a given time, it is natural that the LLR memory 114 will hold the current LLR values of the different bit nodes, as explained above. (The present description refers to binary codes, bits and bit nodes, but can be generalized in a straightforward manner to non-binary codes, symbols and symbol nodes.) The LLR of a given bit node comprises a sum of the messages that were sent to this bit node from the check nodes. In some implementations, the LLR memory may hold the sum of check node messages from the previous iteration (plus the initial a-priori LLR that was set during initialization). In other implementations, the LLR memory may hold the sum of the most updated messages that were sent from the check nodes, including messages that were generated in the current iteration. For this purpose, whenever a check node generates a new message in the current iteration, all the LLRs of the bit nodes that connect to this check node are updated by replacing the value of the check node message from the previous iteration, which is included as part of the LLR sum, by the value of the check node message from the current iteration. This approach is sometimes referred to as "layered" or "serial" decoding. Decoding schemes of this sort are described, for example, by Han and Liu, in "An Efficient Dynamic Schedule for Layered Belief-Propagation Decoding of LDPC Codes," IEEE Communications Letters, Vol. 13, No. 12, December 2009, pages 950-952, which is incorporated herein by reference. The main advantage of this approach is that by using more updated messages, the number of decoding iterations can be reduced.

Practically, however, it is not straightforward to store the sum of all check node messages when the "serial" approach is used. Consider, for example, a check node message that is updated in a certain layer. In each layer, only the memory locations that correspond to bit nodes that participate in the appropriate check equation need to be accessed (it is desired to reduce the number of accesses as much as possible in order to reduce decoding time, as explained above). The next time that these locations will be accessed will be in the next layer where these bits take part in the appropriate check equation. Until then, there is no opportunity to update the LLRs.

In principle, it is possible to wait until the next time that these locations in the bit node memory will be accessed, then read the "missing" check node message from the check node memory (memory 148 in the example of FIG. 5), and update the bit node message immediately before being used. However, as this memory is slow, as explained above, it will take a long time to perform the update. Therefore, the missing message should be taken from the fast memory (memory 150 in the example of FIG. 5). However, the data in this memory is valid only for a single layer.

Therefore, there are two cases. If the bit node participates in the next layer (i.e., there are two consecutive non-zero elements in the appropriate column of the parity check matrix), then the missing message can be simply taken from the fast memory and added prior to being used (using adder 156 in the example of FIG. 5). If the bit node does not participate in the next layer, a clock cycle has to be wasted during the processing of the next layer to add it to the stored bit node message, otherwise it will no longer be available from the fast memory. The LLR with the "missing" check node message will be written to the LLR memory during processing of the current layer. Then, it will be read, updated and written back during processing of the next layer. This results in additional processing time (due to the wasted cycle) and additional power consumption (due to the additional read/write operations).

In BP decoding, the bit node sends to each check node a different message, which does not include the message that was received from this check node (this is usually referred to as "extrinsic information"). Therefore, for an LLR value that holds the sum of all the appropriate check node messages, the check node message that corresponds to the target of the bit-to-check node message should be subtracted from the bit node value. In the example of FIG. 5, this subtraction is performed using subtractor 160.

To summarize, the scheme of FIG. 5 operates in three possible ways:

A check node message is still missing from the stored bit node value (i.e., a bit participates in two consecutive layers and the second layer is now being processed). In this case, the missing message from the previous layer should be added to the bit node value, and the message that corresponds to the target check node should be subtracted, as described above. For this case, when processing a given bit in a given row of matrix H, the decoder fetches the current LLR value of this bit from memory 144. The decoder fetches from memory 150 the message that was sent to the bit node of this bit in the previous layer (i.e., in processing of the previous row of matrix H). The decoder also fetches from memory 148 the message that was sent to the bit node in the previous iteration. Note that fetching the previous iteration messages from memory 148 occurs only once per layer, so the slowness of memory 148 does not delay the decoding. Adder 156 sums the current LLR of the bit and the message from the previous layer. Subtractor 160 calculates the difference between the output of adder 156 and the message from the previous iteration. In other words, subtractor 160 outputs the sum of the messages that were sent to the bit node from all the check nodes except the check node that corresponds to the currently-processed row.

All the check node messages are already updated in the stored LLR sum (i.e., a clock cycle was wasted in the layer following the most recent layer where this bit node was used). In this case, there is only a need to subtract the appropriate check node message, and adder 156 is fed with "0" or bypassed.

The LLR sum is updated during a "wasted cycle", as described above. In this case, adder 156 is activated, and subtractor 160 is fed with "0" or bypassed.

In all the above cases, the output of subtractor 160 is fed back to LLR memory 114, in order to update the LLR of the bit node in question.

Decoder 140 applies the rows of matrix H sequentially to the input code word, in ascending order of the rows. Typically, the decoder performs several iterations, i.e., scans the matrix several times while updating the bit node LLRs. Following this iterative process, the decoder determines the bit value of each bit node based on the respective LLRs. The decoded bits are then provided as output.

Over an entire decoding iteration (full processing of the matrix), the total number of additions, as well as the total number of subtractions, is equal to the number of non-zero elements in matrix H, since for each non-zero element, there is one addition and one subtraction, which are either done in the same clock cycle, or in separate clock cycles (in case of a "wasted" clock cycle). However, the number of read operations from LLR memory 114, as well the total number of clock cycles, depends on the number of "wasted" clock cycles that occurred during the decoding process. If two or more non-zero elements in a given matrix column are concentrated in a consecutive run, the number of "wasted" clock cycles, as well as the number of read operations from LLR memory 114, can be reduced considerably. As a result, the number of clock cycles per iteration (i.e., decoding latency) and power consumption are reduced.

If the matrix columns do not contain any runs of consecutive non-zero elements, then the decoder would typically read the LLR memory twice for each non-zero element—once for computing the messages from the bit nodes to the check nodes, and once for computing the messages in the opposite direction (i.e., once for storing the LLR sum with the missing message, and once at the "wasted cycle" for completing the missing message). When the matrix column comprises a run of multiple consecutive non-zero elements, only the last non-zero element in the run is read twice, and the other non-zero elements in the run are read only once. The number of read operations from the bit node memory per non-zero element for a specific column is given by 1+1/r, wherein r denotes the run length for this column, i.e., the number of non-zero elements per run for this column. The same is true for the number of write operations—the number of write operations to the bit node memory per non-zero element for a specific column is given by 1+1/r.

Thus, by concentrating the non-zero elements of each column in runs, the number of read/write operations from/to the LLR memory, and the associated latency and throughput, can be reduced by approximately 50%. This performance improvement can be used, for example, to double the decoder throughput for the same power consumption, or to half the decoder power consumption for the same throughput and latency. In some embodiments, decoder 140 (or decoder 90 or other decoder used in system 20 or 60) decodes LDPC code words that conform to the parity check matrices described herein, and thus operates at reduced power consumption, higher throughput and/or reduced latency.

Note that the first and last elements in a given column are also considered "consecutive" in the present context. In other words, runs of non-zero elements may continue cyclically: If the first x elements and the last y elements in a given column are non-zero, this column is considered as having a run of x+y consecutive non-zero elements.

In some practical cases, concentrating the non-zero elements in runs may cause some degradation in decoding performance, e.g., in the achievable Frame Error Rate (FER). Therefore, in some embodiments the LDPC code is designed so that only a portion of the columns of matrix H comprise runs of consecutive non-zero elements. In a typical embodiment, at least 90% of the matrix columns comprise runs of two or more consecutive non-zero elements, and 10% or less of the columns do not have this constraint. Simulations have shown that this 90%/10% trade-off typically provides considerable reduction of power consumption and latency, with little or no effect on decoding performance. In alternative embodiments, at least 85% of the matrix columns comprise runs of two or more consecutive non-zero elements, and 15% or less of the columns do not have this constraint.

Typically, the parity check matrix is sparse, i.e., comprises only a relatively small number of non-zero elements. In a typical sparse matrix, no more that 10% of the matrix elements are non-zero. The 10% upper bound is chosen because having more than 10% non-zero matrix elements may cause loops in the bit-nodes check-nodes graph, which may inhibit convergence of the iterative decoding process.

In some embodiments, the LDPC code is designed such that the runs of non-zero elements in different columns are located at different row positions. (The term "row position" may refer to the start row and/or the end row of a given run, i.e., the row of the first and/or last non-zero element in the run.) Moreover, the runs in adjacent columns are not all linearly related to one another. The term "not linearly related" means that the row positions of the runs in three or more successive columns do not follow an (increasing or decreasing) arithmetic series. In other words, the row positions of the runs in a given set of three or more adjacent columns are not linearly related if they do not advance (increase or decrease) by a fixed increment.

In some embodiments, the row positions of the runs in different columns are uncorrelated with one another. In some embodiments, the row positions of the runs in different columns are selected at random. In certain embodiments, the non-linearity constraint is imposed only locally, e.g., on any set of three adjacent columns (referred to as an adjacent column triplet). In these embodiments, the row positions of the runs in any set of three adjacent columns do not advance (increase or decrease) by a fixed increment. In some embodiments, the non-linearity constraint is imposed only on a given portion of the adjacent column triplets, e.g., 85% or 90% of the triplets.

It is possible in principle to design parity check matrices in which adjacent columns have runs of non-zero elements at row positions that advance at a fixed increment. Such LDPC codes, however, would be limited in the choice of code rate and would suffer from reduced coding gain because of the orderly structure of the matrix. The LDPC codes described herein, on the other hand, have parity check matrices that enable better flexibility in choosing the code rate. In addition, the disclosed parity check matrices have a more randomized structure, and therefore enable higher coding gain. When the decoder uses a message-passing process, the increased randomization of the parity check matrix enables better propagation of messages between the bit nodes and symbol nodes. At the same time, the disclosed parity check matrices provide considerable reduction in power consumption and latency, because of the concentration of non-zero elements in runs.

FIG. 6 is a diagram showing a parity check matrix 170 of an LDPC code, in accordance with an embodiment of the present invention. In the present example, each code word is twenty bits long, and the code has ten parity check equations. Each column has four non-zero elements, and the total number of non-zero elements in the matrix is eighty. As can be seen in the figure, each column of matrix 170 comprises a run of two or more consecutive non-zero elements. Several example runs 174A . . . 174D are marked in the figure. The row positions of the runs are not linearly related, i.e., do not advance by a fixed increment.

When decoding the LDPC code defined by matrix 170, the total number of read cycles per iteration is 108. In comparison, a randomly-generated parity check matrix of the same size and same number of non-zero elements (but which has few or no runs of non-zero elements) will typically require >130 read cycles per iteration. As another comparison, a parity check matrix in which each column has a single run of four non-zero elements would require 100 read cycles per iteration.

In some embodiments, the parity check matrix comprises a block matrix. In these embodiments, each matrix element is a sub-matrix, each row is a row of sub-matrices and each column is a column of sub-matrices. Each matrix element of the block matrix (i.e., each sub-matrix) may comprise an all-zeros matrix, or a circulant matrix. A commonly-used example of circulant matrices is matrices whose rows are certain cyclic shift of the rows of an identity matrix. A Block matrix of this kind is referred to as a Quasi-Cyclic (QC) matrix. Note that a QC block matrix may not be sparse at the block level (i.e., it may comprise a relatively large number of non-zero sub-matrices), but is typically sparse at the individual (scalar) matrix element level.

The disclosed techniques and LDPC code structures can be applied to QC block matrices, by regarding the all-zeros sub-matrices as zero elements of the matrix, and the circulant (e.g., shifted identity) sub-matrices as non-zero elements of the matrix. In other words, an LDPC code may be designed with a QC parity check matrix, such that:
  At least a certain portion of the block columns comprise runs of two or more consecutive non-zero elements (circulant sub-matrices).
  In most sets of three adjacent block columns of the block matrix, the runs of non-zero sub-matrices are located at block row positions that do not advance by a fixed increment.

When decoder 140 (or decoder 90 or other decoder used in system 20 or 60) decodes such a code, it operates at reduced power consumption and/or latency, as explained above.

The proposed matrix structure may possess an undesirable property of having loops in the matrix, as explained below. However, this property can be easily overcome in the case of QC parity check matrices. A loop is defined as a loop in the underlying graph of the LDPC code, which comprises the bit nodes and the check nodes. In this graph, each bit node is connected to the check nodes (parity check equations) in which it participates. Generally, good codes should not contain loops of order four. For an arbitrary bit matrix, if the columns contain runs of consecutive bits, loops of order four are difficult to avoid. In FIG. 6, for example, the 2-by-2 sub-matrix at rows 2-3 and columns 1-2 is $$\begin{pmatrix} 1 & 1 \\ 1 & 1 \end{pmatrix},$$

which corresponds to a loop of order four in the graph. When QC matrices are used, on the other hand, loops can be avoided by using different circulant matrices (or different shift values for the case of shifted identity matrices) as sub-matrices.

The decoder configurations of FIGS. 3 and 5 are example configurations, which were chosen purely for the sake of conceptual clarity. In alternative embodiments, any other suitable decoder configuration can also be used. Decoder elements that are not necessary for understanding of the disclosed techniques, such as various clock and interface circuits, have been eliminated from the figure for the same of clarity.

LDPC decoder 48 of FIG. 1, LDPC unit 84 of FIG. 2, decoder 90 of FIG. 3 and decoder 140 of FIG. 5 may be implemented in software, in hardware or using a combination of hardware and software elements. In some embodiments, decoder 48, unit 84, decoder 90 and/or decoder 140 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In some embodiments, decoder 48, unit 84, decoder 90 and/or decoder 140 (including units 98, 102, 106, 144, 148, 152, 156 and 160) are implemented in hardware, such as using one or more Application-Specific Integrated Circuits (ASICs), Field-Programmable gate Arrays (FPGAs) and/or discrete components. Some or all of the decoder functions may alternatively be implemented in software, or using a combination of software and hardware elements.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for error correction coding, comprising:
  accepting a first definition of a mother Error Correction Code (ECC), which is represented by a set of parity check equations and comprises first code words, each first code word comprising one or more check symbols;
  accepting a second definition of a punctured ECC comprising second code words, which is derived from the mother ECC by removal of one or more of the parity check equations and removal of one or more punctured check symbols, selected from among the check symbols of the first code words;
  providing a mother decoder, which is designed to decode the first code words of the mother ECC by exchanging messages between symbol nodes and check nodes in accordance with a predefined interconnection scheme that represents the mother ECC; and
  decoding an input code word of the punctured ECC using the mother decoder by initializing one or more of the symbol nodes and controlling one or more of the exchanged messages responsively to the punctured ECC, and while retaining the predefined interconnection scheme representing the mother ECC;

wherein controlling the exchanged messages comprises preventing the messages originating from one or more check nodes that correspond to the parity check equations that were removed from the mother code from affecting the symbol nodes.

2. The method according to claim 1, wherein the mother ECC and the punctured ECC comprise Low Density Parity Check (LDPC) codes.

3. The method according to claim 1, wherein initializing the symbol nodes comprises assigning the symbol nodes corresponding to the symbols of the input code word respective confidence metrics, and assigning the symbol nodes corresponding to the punctured check symbols respective artificial confidence metrics that indicate a given symbol value with high likelihood.

4. The method according to claim 3, wherein the artificial confidence metrics indicate a zero symbol value with maximal likelihood.

5. The method according to claim 3, wherein assigning the artificial confidence metrics comprises forcing the symbol nodes corresponding to the punctured check symbols to maintain the artificial confidence metrics during decoding of the input code word.

6. The method according to claim 1, wherein preventing the messages from affecting the symbol nodes comprises forcing the messages originating from the one or more check nodes to zero.

7. The method according to claim 1, and comprising outputting respective values of the symbol nodes as a decoding result of the input code word.

8. The method according to claim 1, wherein the mother ECC is represented by a parity check matrix, and comprising producing the code word of the punctured ECC by:

removing from the parity check matrix of the mother ECC one or more columns corresponding to the removed check symbols and one or more rows corresponding to the removed parity check equations, to produce a modified parity check matrix; and encoding data using the modified parity check matrix, to produce the code word of the punctured ECC.

9. The method according to claim 1, wherein the set of the parity check equations is represented by a block matrix comprising multiple blocks, such that some of the blocks comprise all-zeros sub-matrices, and all the blocks other than the all-zeros sub-matrices comprise circulant sub-matrices.

10. A method for error correction coding, comprising:
accepting a code word by a decoder, wherein the code word comprises data encoded with an Error Correction Code (ECC) that is represented by a parity check matrix comprising matrix elements arranged in rows and columns, such that at least a predefined portion of the columns comprise respective runs of two or more consecutive non-zero matrix elements, and such that the runs in adjacent columns are located at respective row positions that are not all linearly related to one another; and
decoding the code word by the decoder so as to reconstruct the data;
wherein the predefined portion comprises 85% of the columns.

11. The method according to claim 10, wherein the respective row positions of the runs in a given portion of adjacent column triplets do not advance by a fixed increment.

12. The method according to claim 10, wherein the row positions of the runs are uncorrelated with one another.

13. The method according to claim 10, wherein the row positions of the runs are random.

14. The method according to claim 10, wherein the parity check matrix comprises a block matrix, wherein the non-zero matrix elements comprise circulant sub-matrices, and wherein the matrix elements other than the non-zero elements comprise all-zeros sub-matrices.

15. The method according to claim 14, wherein the circulant sub-matrices comprise cyclically-shifted identity sub-matrices.

16. A method for error correction coding, comprising:
accepting a code word by a decoder, wherein the code word comprises data encoded with an Error Correction Code (ECC) that is represented by a parity check matrix comprising matrix elements arranged in rows and columns, such that at least a predefined portion of the columns comprise respective runs of two or more consecutive non-zero matrix elements, and such that the runs in adjacent columns are located at respective row positions that are not all linearly related to one another; and
decoding the code word by the decoder so as to reconstruct the data;
wherein the predefined portion comprises 90% of the columns.

17. A method for error correction coding, comprising:
accepting a code word by a decoder, wherein the code word comprises data encoded with an Error Correction Code (ECC) that is represented by a parity check matrix comprising matrix elements arranged in rows and columns, such that at least a redefined portion of the columns comprise respective runs of two or more consecutive non-zero matrix elements, and such that the runs in adjacent columns are located at respective row positions that are not all linearly related to one another; and
decoding the code word by the decoder so as to reconstruct the data;
wherein the non-zero matrix elements make up no more than 10% of all the matrix elements in the parity check matrix.

18. Apparatus for error correction coding, comprising:
decoding circuitry, which is configured to decode a mother Error Correction Code (ECC) that is represented by a set of parity check equations and comprises first code words each comprising one or more check symbols, by exchanging messages between symbol nodes and check nodes in accordance with a predefined interconnection scheme that represents the mother ECC; and
control circuitry, which is configured to accept a definition of a punctured ECC comprising second code words, which is derived from the mother ECC by removal of one or more of the parity check equations and removal of one or more punctured check symbols, selected from among the check symbols of the first code words, and to cause the decoding circuitry to decode an input code word of the punctured ECC by initializing one or more of the symbol nodes and controlling one or more of the exchanged messages responsively to the punctured ECC, while retaining the predefined interconnection scheme representing the mother ECC;
wherein the control circuitry is configured to control the exchanged messages by preventing the messages originating from one or more check nodes that correspond to the parity check equations that were removed from the mother code from affecting the symbol nodes.

19. The apparatus according to claim 18, wherein the mother ECC and the punctured ECC comprise Low Density Parity Check (LDPC) codes.

20. The apparatus according to claim 18, wherein the control circuitry is configured to assign the symbol nodes corresponding to the symbols of the input code word respective confidence metrics, and to assign the symbol nodes corresponding to the punctured check symbols respective artificial confidence metrics that indicate a given symbol value with high likelihood.

21. The apparatus according to claim 20, wherein the artificial confidence metrics indicate a zero symbol value with maximal likelihood.

22. The apparatus according to claim 20, wherein the control circuitry is configured to force the symbol nodes corresponding to the punctured check symbols to maintain the artificial confidence metrics during decoding of the input code word.

23. The apparatus according to claim 18, wherein the control circuitry is configured to prevent the messages from affecting the symbol nodes by forcing the messages originating from the one or more check nodes to zero.

24. The apparatus according to claim 18, wherein the decoding circuitry is configured to output respective values of the symbol nodes as a decoding result of the input code word.

25. The apparatus according to claim 18, wherein the mother ECC is represented by a parity check matrix, and comprising encoding circuitry, which is configured to produce the code word of the punctured ECC by:
removing from the parity check matrix of the mother ECC one or more columns corresponding to the removed check symbols and one or more rows corresponding to the removed parity check equations, to produce a modified parity check matrix; and
encoding data using the modified parity check matrix, to produce the code word of the punctured ECC.

26. The apparatus according to claim 18, wherein the set of the parity check equations is represented by a block matrix comprising multiple blocks, such that some of the blocks comprise all-zeros sub-matrices, and all the blocks other than the all-zeros sub-matrices comprise circulant sub-matrices.

27. Apparatus for error correction coding, comprising:
control circuitry, which is configured to accept a definition of an Error Correction Code (ECC) that is represented by a parity check matrix comprising matrix elements arranged in rows and columns, such that at least a predefined portion of the columns comprise respective runs of two or more consecutive non-zero matrix elements, and such that the runs in adjacent columns are located at respective row positions that are not all linearly related to one another; and
decoding circuitry, which is configured to accept a code word, which comprises data encoded with the ECC and to decode the code word so as to reconstruct the data;
wherein the predefined portion comprises 85% of the columns.

28. The apparatus according to claim 27, wherein the respective row positions of the runs in a given portion of adjacent column triplets do not advance by a fixed increment.

29. The apparatus according to claim 27, wherein the row positions of the runs are uncorrelated with one another.

30. The apparatus according to claim 27, wherein the row positions of the runs are random.

31. The apparatus according to claim 27, wherein the parity check matrix comprises a block matrix, wherein the non-zero matrix elements comprise circulant sub-matrices, and wherein the matrix elements other than the non-zero elements comprise all-zeros sub-matrices.

32. The apparatus according to claim 31, wherein the circulant sub-matrices comprise cyclically-shifted identity sub-matrices.

33. Apparatus for error correction coding, comprising:
control circuitry, which is configured to accept a definition of an Error Correction Code (ECC) that is represented by a parity check matrix comprising matrix elements arranged in rows and columns, such that at least a predefined portion of the columns comprise respective runs of two or more consecutive non-zero matrix elements, and such that the runs in adjacent columns are located at respective row positions that are not all linearly related to one another; and
decoding circuitry, which is configured to accept a code word, which comprises data encoded with the ECC and to decode the code word so as to reconstruct the data;
wherein the predefined portion comprises 90% of the columns.

34. Apparatus for error correction coding, comprising:
control circuitry, which is configured to accept a definition of an Error Correction Code (ECC) that is represented by a parity check matrix comprising matrix elements arranged in rows and columns, such that at least a predefined portion of the columns comprise respective runs of two or more consecutive non-zero matrix elements, and such that the runs in adjacent columns are located at respective row positions that are not all linearly related to one another; and
decoding circuitry, which is configured to accept a code word, which comprises data encoded with the ECC and to decode the code word so as to reconstruct the data;
wherein the non-zero matrix elements make up no more than 10% of all the matrix elements in the parity check matrix.

* * * * *